United States Patent
Kim et al.

(10) Patent No.: US 7,990,776 B2
(45) Date of Patent: Aug. 2, 2011

(54) SEMICONDUCTOR MEMORY DEVICE WITH OPTIMUM REFRESH CYCLE ACCORDING TO TEMPERATURE VARIATION

(75) Inventors: Se-Jun Kim, Ichon-shi (KR); Sang-Hoon Hong, Ichon-shi (KR); Jae-bum Ko, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 1636 days.

(21) Appl. No.: 10/882,137

(22) Filed: Jun. 29, 2004

(65) Prior Publication Data
US 2005/0141311 A1 Jun. 30, 2005

(30) Foreign Application Priority Data
Dec. 29, 2003 (KR) .................. 10-2003-0098505

(51) Int. Cl.
*G11C 7/06* (2006.01)
(52) U.S. Cl. .............. 365/189.07; 365/189.09; 365/211; 365/222
(58) Field of Classification Search ............. 365/189.07, 365/189.09, 211, 222
See application file for complete search history.

(56) References Cited

U.S. PATENT DOCUMENTS

| | | | | |
|---|---|---|---|---|
| 5,532,968 | A * | 7/1996 | Lee | 365/222 |
| 5,784,328 | A * | 7/1998 | Irrinki et al. | 365/222 |
| 7,027,343 | B2 * | 4/2006 | Sinha et al. | 365/222 |
| 7,460,394 | B2 * | 12/2008 | Happ et al. | 365/163 |
| 7,623,401 | B2 * | 11/2009 | Philipp et al. | 365/222 |
| 2002/0180543 | A1 | 12/2002 | Song et al. | |
| 2003/0081486 | A1 | 5/2003 | Yamauchi et al. | |

FOREIGN PATENT DOCUMENTS

| | | |
|---|---|---|
| JP | 03-207084 A | 9/1991 |
| JP | 07-296582 A | 11/1995 |
| JP | 2002-323384 A | 11/2002 |
| KR | 100200723 B1 | 3/1999 |
| KR | 1020020002509 A | 1/2002 |
| KR | 1020020091657 A | 12/2002 |

* cited by examiner

*Primary Examiner* — Pho M Luu
(74) *Attorney, Agent, or Firm* — Kilpatrick Townsend & Stockton LLP

(57) ABSTRACT

A semiconductor memory device, which performs a refresh operation, includes: a temperature sensing unit for measuring temperature and for generating a temperature controlled voltage and a reference current based on the measured temperature; an analog-digital conversion unit for converting the temperature controlled voltage to an N-bit digital signal; a refresh control unit for generating a refresh signal in response to the N-bit digital signal, wherein, a period of the refresh signal is controlled based on the N-bit digital signal.

24 Claims, 9 Drawing Sheets

SEMICONDUCTOR MEMORY DEVICE WITH OPTIMUM REFRESH CYCLE ACCORDING TO TEMPERATURE VARIATION

This application claims priority to Korean Patent Application No. 10-2003-0098505, filed Dec. 29, 2003, titled "Semiconductor Memory Device with Optimum Refresh Cycle According to Temperature Variation," which is incorporated by reference herein in its entirety for all purposes.

FIELD OF INVENTION

The present invention relates to a semiconductor memory device; and, more particularly, to a semiconductor memory device capable of controlling a refresh cycle according to a temperature variation.

DESCRIPTION OF PRIOR ART

Generally, a semiconductor memory device is classified into two different types: one is a dynamic random access memory (DRAM) and the other is a static random access memory (SRAM).

Since a memory cell included in the SRAM is formed by four latched transistors, the SRAM can hold its data without a refresh operation as long as power is supplied to the SRAM.

In contrast, a memory cell included in the DRAM is formed by a transistor and a capacitor; and the capacitor is charged or discharged for the DRAM operation. However, charge quantity stored in the capacitor reduces as time passes. Therefore, the DRAM must be refreshed periodically in order to hold its data contents.

A refresh cycle is required to be changed according to a temperature variation.

FIG. 1 is a graph showing a relation between the temperature variation and the refresh cycle.

As shown, the refresh cycle should be shorted as temperature increases because a current leakage of a capacitor included in the memory cell is rapidly increased as temperature increased.

Therefore, if the refresh cycle is set to be suitable for only a room temperature, data stored in the semiconductor memory device may be easily lost when temperature is higher than the room temperature.

Therefore, generally, the refresh cycle is set to be suitable for a highest operational temperature so that the semiconductor memory device can hold its data stably even if temperature is increased. Herein, the highest operational temperature is a maximum temperature where the semiconductor memory device can operates. However, since the refresh cycle is fixed for the highest operational temperature, the semiconductor memory device performs a refresh operation too frequently consuming much power even if temperature is much lower than the highest operational temperature.

Therefore, a semiconductor memory device capable of controlling the refresh cycle according to the temperature variation has been introduced.

FIG. 2 is a block diagram showing a conventional semiconductor memory device capable of controlling the refresh cycle according to the temperature variation.

As shown, the conventional semiconductor memory device includes a temperature sensor 10, a refresh controller 20 and a memory core block 30.

The temperature sensor 10 receives a temperature signal tmp in order to generate a high temperature sensing signal TH and a low temperature sensing signal TL based on the temperature signal tmp.

The refresh signal 20 receives the high temperature sensing signal TH and the low temperature sensing signal TL in order to generate a refresh signal ref based on the high temperature sensing signal TH and the low temperature sensing signal TL, and the memory core block 30 performs a refresh operation in response to the refresh signal ref.

FIG. 3 is a schematic circuit diagram showing the temperature sensor 10.

As shown, the temperature sensor 10 includes a first delay line 11, a second delay line 12 and a signal output unit 13.

The first delay line 11 includes a plurality of inverters connected in series, and the second delay line 12 includes a plurality of inverters and resistors connected in series. Herein, a delay amount of the first delay line 11 is more sensitive to temperature than that of the second delay line 12, i.e., a delay amount variation of the first delay line 11 is larger than that of the second delay line 12 according to the temperature variation.

The first and the second delay lines 11 and 12 delay the temperature signal tmp in order to generate a temperature sensitive delay signal TSD and a temperature insensitive delay signal TISD respectively.

The signal output unit 13 receives the temperature sensitive delay signal TSD and the temperature insensitive delay signal TISD in order to generate the high temperature sensing signal TH and the low temperature sensing signal TL by performing a logic operation to the temperature sensitive delay signal TSD and the temperature insensitive delay signal TISD.

FIGS. 4A and 4B are timing diagrams showing an operation of the temperature sensor 10 shown in FIG. 3. Referring to FIGS. 1 to 4B, an operation of the conventional semiconductor memory device is described below.

The first and the second delay lines 11 and 12 receive the temperature signal tmp for generating the temperature sensitive delay signal TSD and the temperature insensitive delay signal TISD respectively by delaying the temperature signal tmp. Herein, as above mentioned, the delay amount variation of the first delay line 11 is larger than that of the second delay line 12 according to the temperature variation.

Therefore, at a low temperature, a delay amount of the first delay line 11 is more reduced than that of the second delay line 12. As a result, a delay amount of the first delay line 11 becomes smaller than that of the second delay line 12 and, thus, the temperature sensitive delay signal TSD outputted from the first delay line 11 becomes in a logic high level at an earlier time than the temperature insensitive delay signal TISD.

Thereafter, the signal output unit 13 outputs the low temperature sensing signal TL which is in a logic high level when the temperature sensitive signal TSD is in a logic high level and the temperature insensitive signal TISD is in a logic low level as shown in FIG. 4A.

Then, the refresh controller 20 generates the refresh signal ref in response to the low temperature sensing signal TL so that the memory core block 30 can perform the refresh operation in response to the refresh signal ref.

On the other hand, at a high temperature, a delay amount of the first delay line 11 is more increased than that of the second delay line 12. As a result, a delay amount of the first delay line 11 becomes larger than that of the second delay line 12, and, thus, the temperature insensitive delay signal TISD outputted from the second delay line 12 becomes in a logic high level at an earlier time than the temperature sensitive delay signal TSD.

Thereafter, the signal output unit 13 outputs the high temperature sensing signal TH which is in a logic high level when the temperature sensitive signal TSD is in a logic low level and the temperature insensitive signal TISD is in a logic high level as shown in FIG. 4B.

Then, the refresh controller 20 generates the refresh signal ref in response to the high temperature sensing signal TH so that the memory core block 30 can perform the refresh operation in response to the refresh signal ref.

As described above, the conventional semiconductor memory device can control a period of a refresh signal according to a temperature variation. However, the conventional semiconductor memory device can have only two different periods of the refresh signal. That is, if temperature of the conventional semiconductor memory device is below than a predetermined temperature, the period of the refresh signal is set to a first value; and, if the temperature is higher than the predetermined temperature, the period of the refresh signal is set to a second value. Therefore, the conventional semiconductor memory device cannot control the period of the refresh signal precisely. Herein, the second value is larger than the first value.

In addition, when the conventional semiconductor memory device is operated, a temperature variation of the conventional semiconductor memory device is usually small. Therefore, the period of the refresh signal of the conventional semiconductor memory device may not be changed while the conventional semiconductor memory device is operated. In this case, a circuit included in the conventional semiconductor memory device for controlling the period of the refresh signal may be useless.

SUMMARY OF INVENTION

It is, therefore, an object of the present invention to provide a semiconductor memory device having an optimum refresh cycle for performing a refresh operation consuming low power.

In accordance with an aspect of the present invention, there is provided a semiconductor memory device, which performs a refresh operation, including: a temperature sensing unit for measuring temperature and for generating a temperature controlled voltage and a reference current based on the measured temperature; an analog-digital conversion unit for converting the temperature controlled voltage to an N-bit digital signal; a refresh control unit for generating a refresh signal in response to the N-bit digital signal, wherein, a period of the refresh signal is controlled based on the N-bit digital signal.

In accordance with another aspect of the present invention, there is provided a method, for generating a refresh signal in a semiconductor memory device, including steps of: measuring temperature of the semiconductor memory device; generating a temperature controlled voltage based on the measured temperature; generating an N-bit digital signal based on the temperature controlled voltage; and generating a refresh signal whose frequency is determined by the N-bit digital signal.

In accordance with further another aspect of the present invention, there is provided a method, for generating a refresh signal in a semiconductor memory device, including steps of: measuring temperature of the semiconductor memory device; generating a temperature controlled voltage based on the measured temperature; generating an N-bit digital signal based on the temperature controlled voltage; generating a refresh signal whose frequency is determined by the N-bit digital signal; and performing the refresh operation in response to the refresh signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
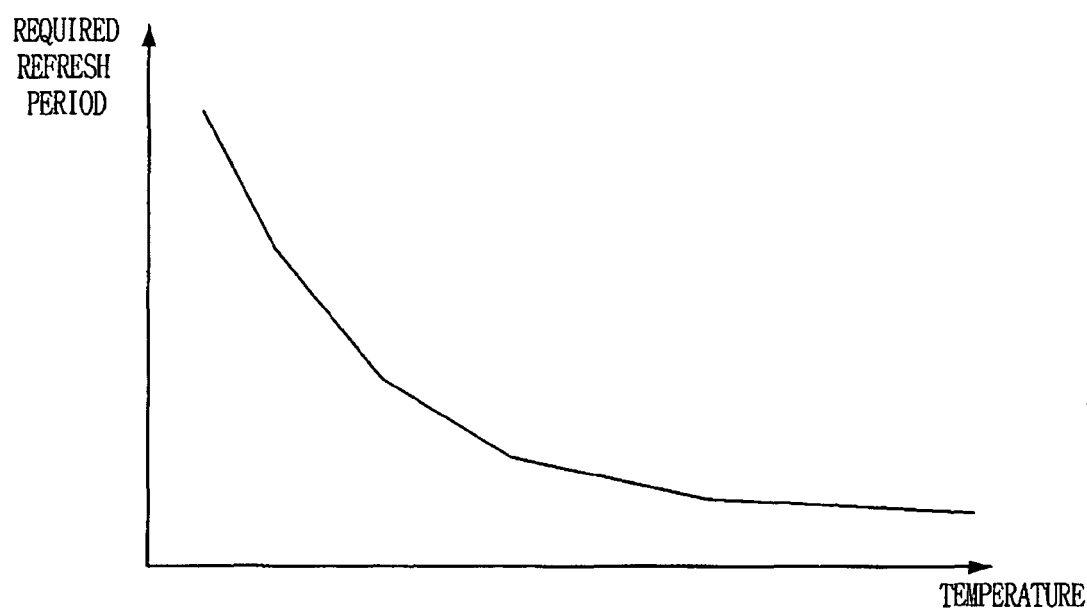
FIG. 1 is a graph showing a relation between a temperature variation and a refresh cycle.
Figure 2:
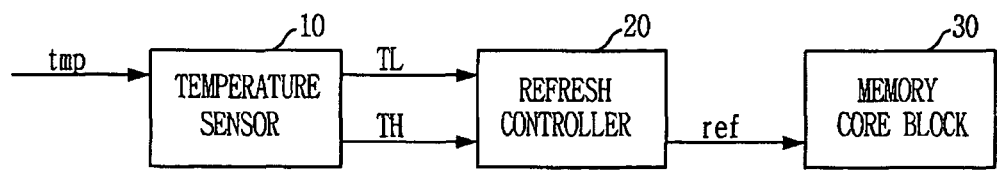
FIG. 2 is a block diagram showing a conventional semiconductor memory device.
Figure 3:
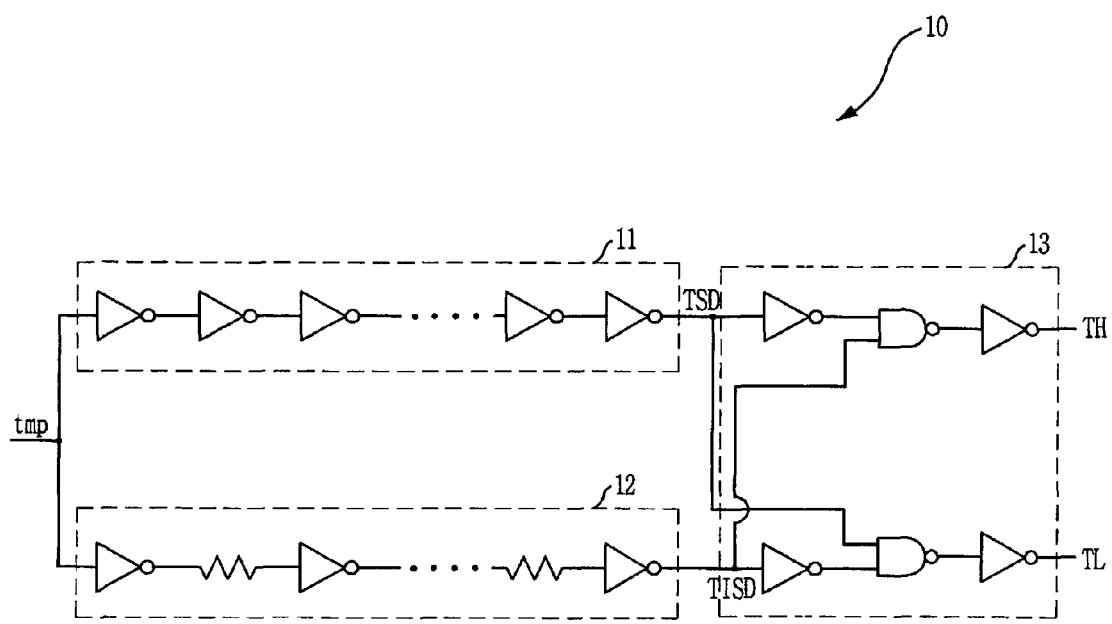
FIG. 3 is a schematic circuit diagram showing a temperature sensor shown in FIG. 2.
Figure 4A:
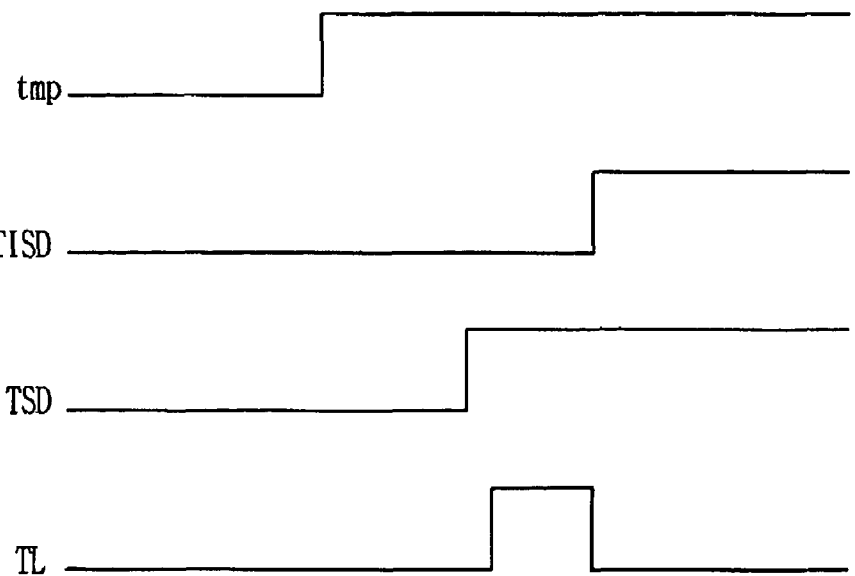
FIGS. 4A and 4B are timing diagrams showing an operation of a temperature sensor shown in FIG. 3.
Figure 4B:
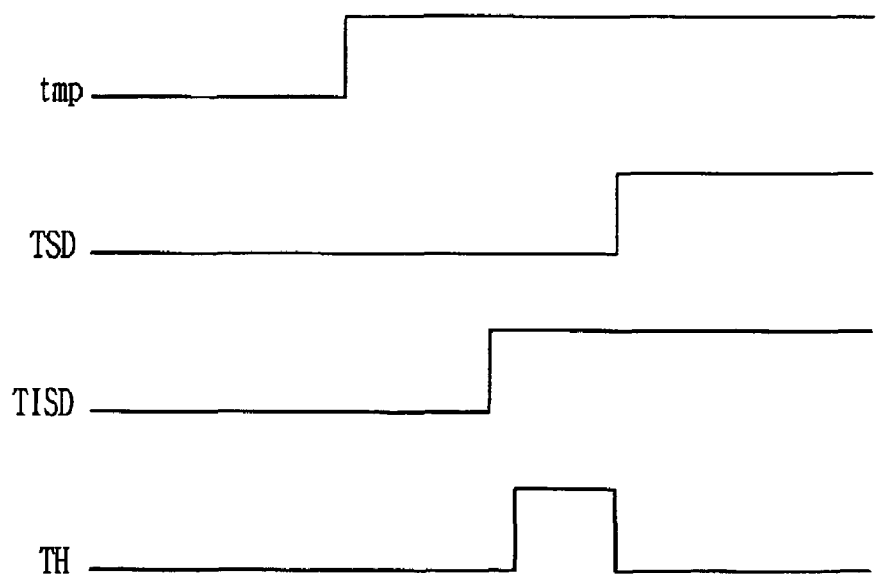
Figure 5:
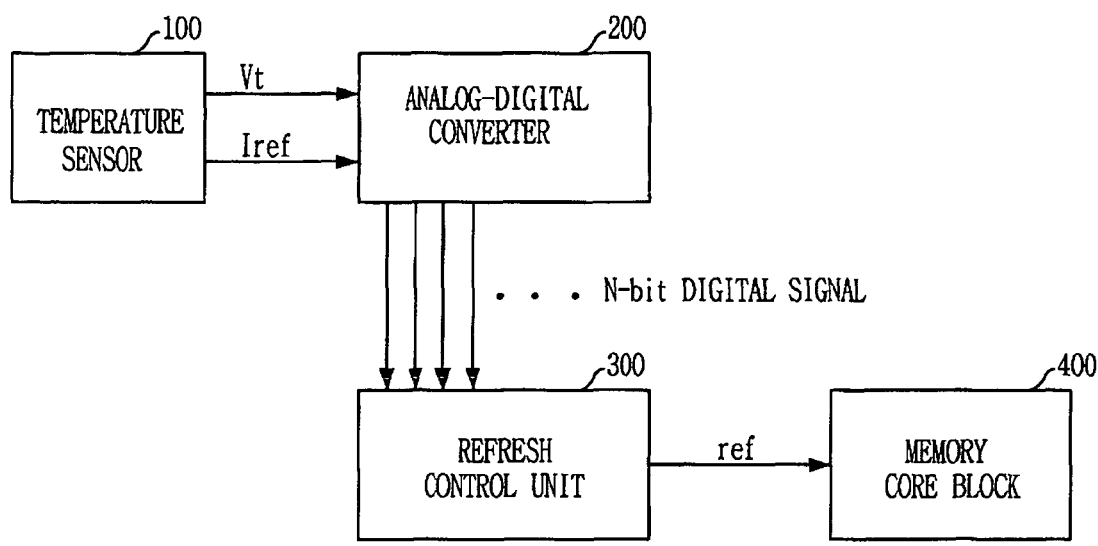
FIG. 5 is a block diagram showing a semiconductor memory device in accordance with a first embodiment of the present invention.

FIG. 5 is a block diagram showing a semiconductor memory device in accordance with a first embodiment of the present invention.

As shown, the semiconductor memory device includes a temperature sensor 100, an analog-digital converter 200, a refresh controller 300 and a memory core block 400.

The temperature sensor 100 measures temperature of the semiconductor memory device in order to output a temperature controlled voltage signal Vt and a reference current Iref according to the measured temperature. Herein, the temperature sensor 100 is turned on while the semiconductor memory device is turned on in order to accurately measure the temperature of the semiconductor memory device.

The analog-digital converter 200 generates an N-bit digital signal in response to the temperature controlled voltage signal Vt for controlling the refresh controller 300.

The refresh controller 300 generates a refresh signal ref in response to the N-bit digital signal. The memory core block 400 performs a refresh operation in response to the refresh signal ref.

Figure 6:
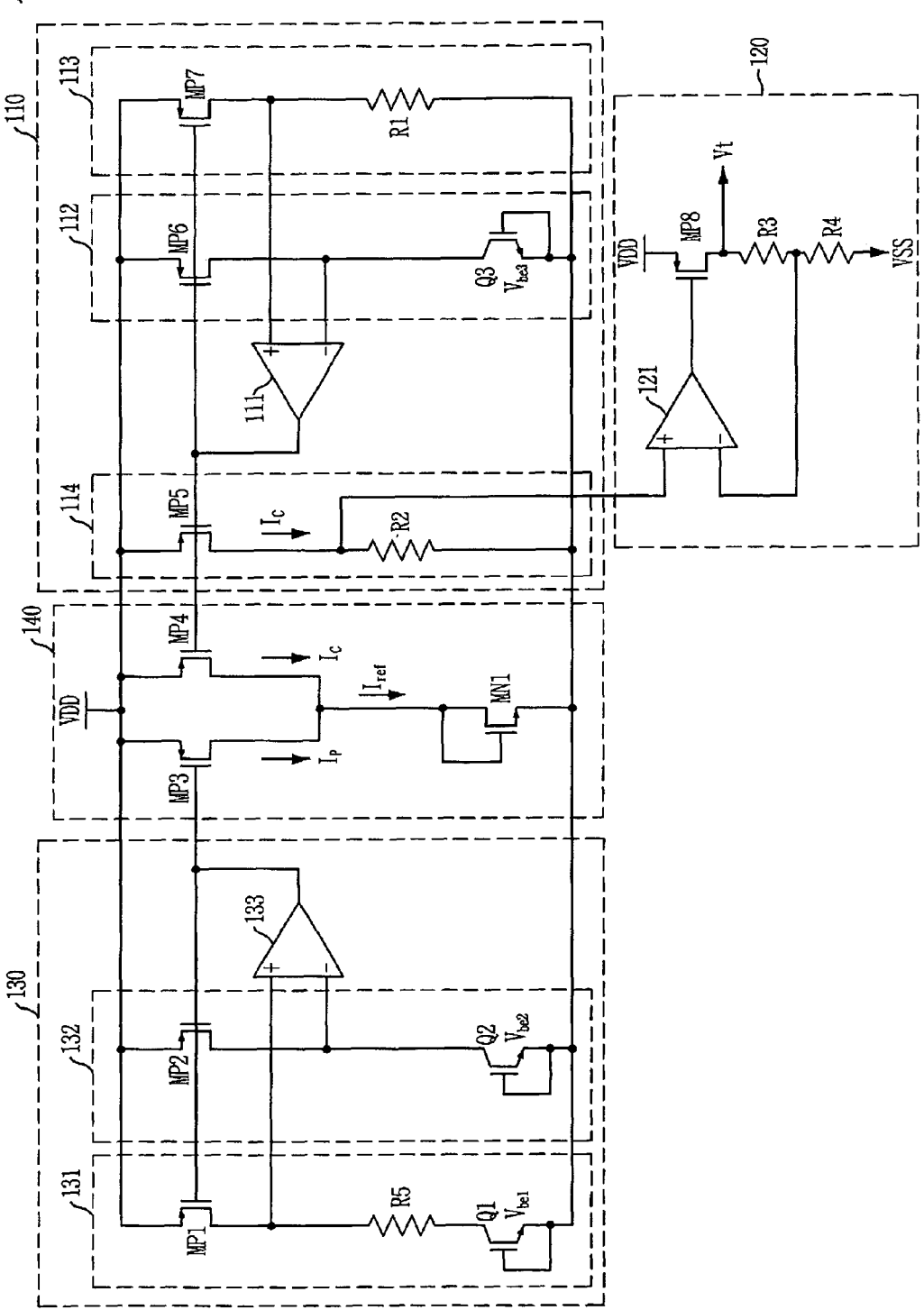
FIG. 6 is a schematic circuit diagram showing a temperature sensor shown in FIG. 5.

FIG. 6 is a schematic circuit diagram showing the temperature sensor 100 shown in FIG. 5.

As shown, the temperature sensor 100 includes a first temperature sensing unit 110, a second temperature sensing unit 130, a temperature controlled voltage generator 120 and a reference current generator 140.

The first temperature sensing unit 110 serves to generate a first current Ic which is decreased as the temperature increases. The second temperature sensing unit 130 serves to generate a second current Ip which is increased as the temperature increases.

The temperature controlled voltage generator 120 generates the temperature controlled voltage signal Vt in response to the first current Ic.

The reference current generator 140 generates the reference current Iref which is a total current of the first current Ic and the second current Ip.

The first temperature sensing unit 110 includes a first unit sensor 113, a first comparator 111, a second unit sensor 112 and an output unit 114.

The first unit sensor 113 includes a seventh p-channel metal oxide semiconductor (PMOS) transistor MP7 and a first resistor R1 in order to generate a constant output voltage between the seventh PMOS transistor MP7 and the first resistor R1 as the temperature increases.

The second unit sensor 112 includes a sixth PMOS transistor MP6 and a third bipolar transistor Q3 in order to generate an output voltage which is increased as the temperature increases.

The first comparator 111 serves to compare the constant output voltage of the first unit sensor 113 with the output voltage of the second unit sensor 112.

The output unit 114 includes a fifth PMOS transistor MP5 and a second resistor R2 for generating the first current Ic based on the comparison result of the first comparator 111.

The temperature controlled voltage generator 120 includes an eighth PMOS transistor MP8, a first operational amplifier 121, a third resistor R3 and a fourth resistor R4.

The eighth PMOS transistor MP8 is connected between a power supply voltage VDD and the third resistor R3, and a gate of the eight PMOS transistor MP8 receives an output signal of the first operational amplifier 121 in order to output the temperature controlled voltage signal Vt.

A main input terminal of the first operational amplifier 121 is connected to a drain of the fifth PMOS transistor MP5 included in the output unit 114, and a sub input terminal of the first operational amplifier 121 is connected between the third resistor R3 and the fourth resistor R4.

The second temperature sensing unit 130 includes a third unit sensor 131, a fourth unit sensor 132 and a second comparator 133.

In detail, the third unit sensor 131 includes a first PMOS transistor MP1, a fifth resistor R5 and a first bipolar transistor Q1. The first PMOS transistor MP1 is connected between the power supply voltage VDD and the fifth resistor R5. The fifth resistor R5 is connected between the first PMOS transistor MP1 and the first bipolar transistor Q1. The first bipolar transistor Q1 is connected between the fifth resistor R5 and a second bipolar transistor Q2 included in the fourth unit sensor 130.

The fourth unit sensor 132 includes a second PMOS transistor MP2 and the second bipolar transistor Q2. The second PMOS transistor Mp2 is connected between the power supply voltage VDD and the second bipolar transistor Q2. The second bipolar transistor Q2 is connected between the second PMOS transistor MP2 and the first bipolar transistor Q1.

A main input terminal of the second operational amplifier 133 is connected to a drain of the first PMOS transistor MP1 and a sub input terminal of the second operational amplifier 133 is connected to a drain of the second PMOS transistor MP2. An output terminal of the second operational amplifier 133 is connected to a third PMOS transistor MP3 included in the reference current generator 140.

The reference current generator 140 includes the third PMOS transistor MP3, a fourth PMOS transistor MP4 and a first n-channel metal oxide semiconductor (NMOS) transistor MN1.

In detail, the third PMOS transistor MP3 is connected between the power supply voltage VDD and the first NMOS transistor MN1. The fourth PMOS transistor MP4 is connected between the power supply voltage VDD and the first NMOS transistor MN1. A drain of the first NMOS transistor MN1 is connected to drains of the third and the fourth PMOS transistors MP3 and MP4.

Figure 7:
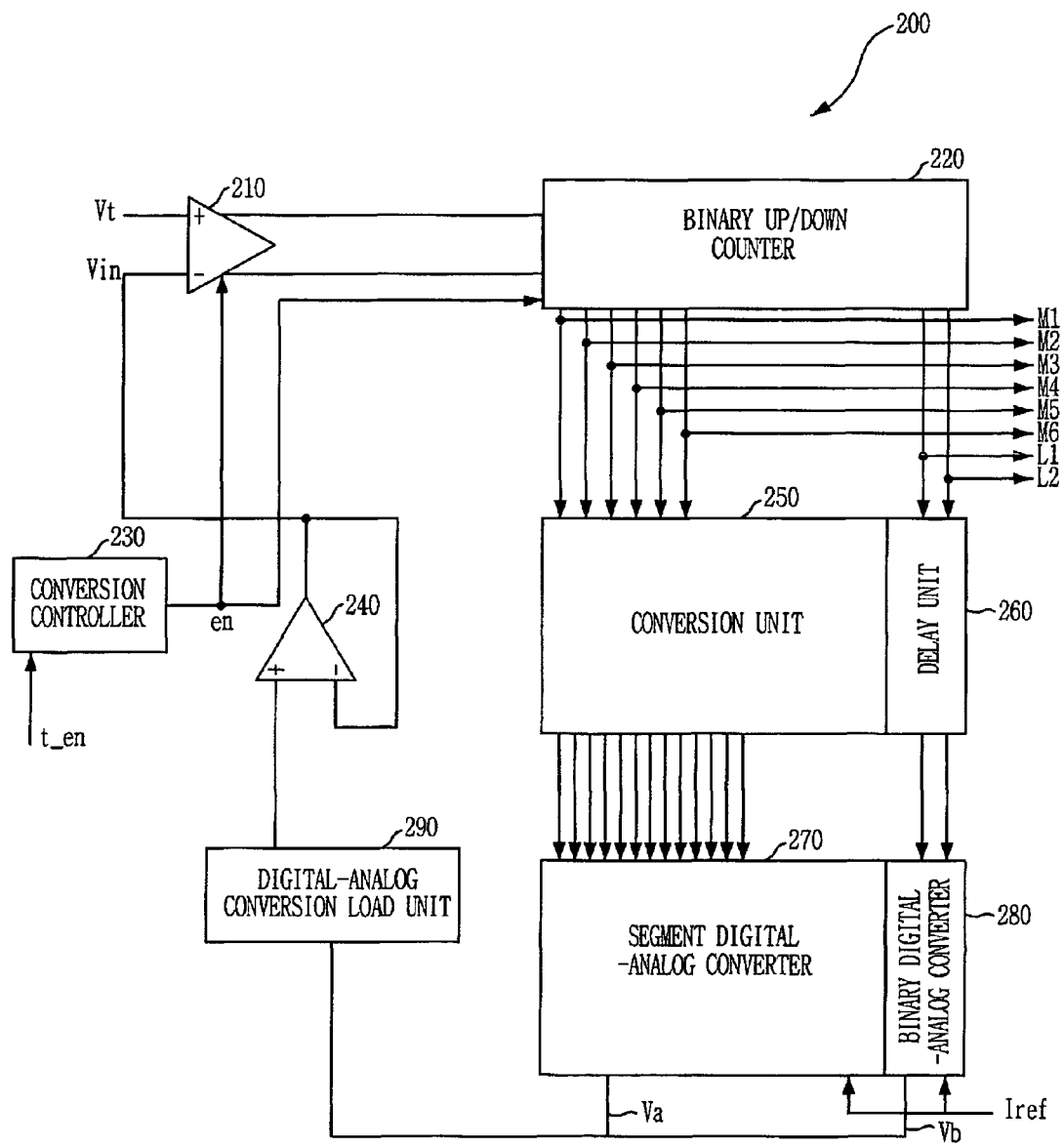
FIG. 7 is a block diagram showing an analog-digital converter shown in FIG. 5.

FIG. 7 is a block diagram showing the analog-digital converter 200 shown in FIG. 5.

As shown the analog-digital converter 200 includes a second comparator 111, a binary up/down counter 220, a conversion controller 230, a code conversion unit 250, a delay unit 260, a segment digital-analog converter 270, a binary digital-analog converter 280, a third operational amplifier 240 and a digital-analog converter load unit 290.

The second comparator 210 receives the temperature controlled voltage signal Vt and an input voltage Vin for comparing the temperature voltage signal Vt and the input voltage Vin and outputting the comparison result to the binary up/down counter 220.

The binary up/down counter 220 generates an 8-bit digital signal based on the comparison result of the second comparator 210. Herein, the 8-bit digital signal includes a first to a sixth upper bit signals M1 to M6; and, a first and a second lower bit signals L1 and L2.

The code conversion unit 250 converts the first to the sixth upper bit signals M1 to M6 to a thermometer code. The delay unit 260 delays the first and the second lower bit signals L1 and L2 for a delay time generated while the code conversion unit 250 converts the first to the sixth upper bit signals M1 to M6 to the thermometer code, and output the delayed first lower bit signal and the delayed second lower bit signal to the binary digital-analog converter 280.

The segment digital-analog converter 270 converts the thermometer code to a first analog voltage signal Va. The binary digital-analog converter 280 converts the delayed first and second lower bit signals to a second analog voltage signal Vb.

The digital-analog converter load unit 290 and the third operational amplifier 240 serve to output the internal voltage Vin based on the first and the second analog voltage signals Va and Vb.

The conversion controller 230 generates an enable signal en in response to an external enable control signal t_en for activating/inactivating the second comparator 210 and the binary up/down counter 220.

Figure 8:
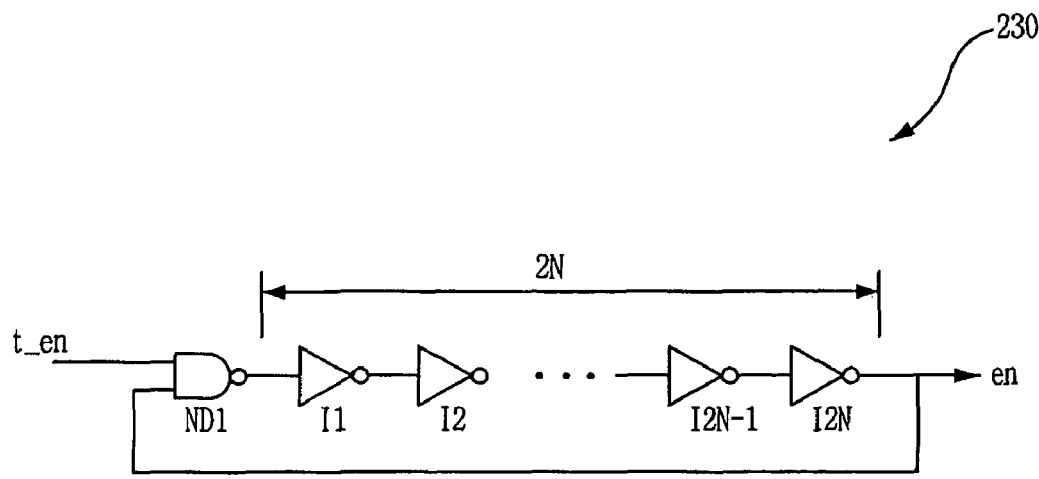
FIG. 8 is a schematic circuit diagram showing a conversion controller shown in FIG. 7.

FIG. 8 is a schematic circuit diagram showing the conversion controller 230 shown in FIG. 7.

As shown, the conversion controller 230 includes a NAND gate ND1 and 2N numbers of inverters I1 to I2N connected in series. The NAND gate ND1 performs a logic NAND operation to the external enable control signal t_en and the enable signal en and outputs the result of the logic NAND operation to the 2N numbers of inverters I1 to I2N. Then, the 2N numbers of inverters I1 to I2N delays an output signal of the NAND gate ND1 in order to output the enable signal en.

Figure 9:
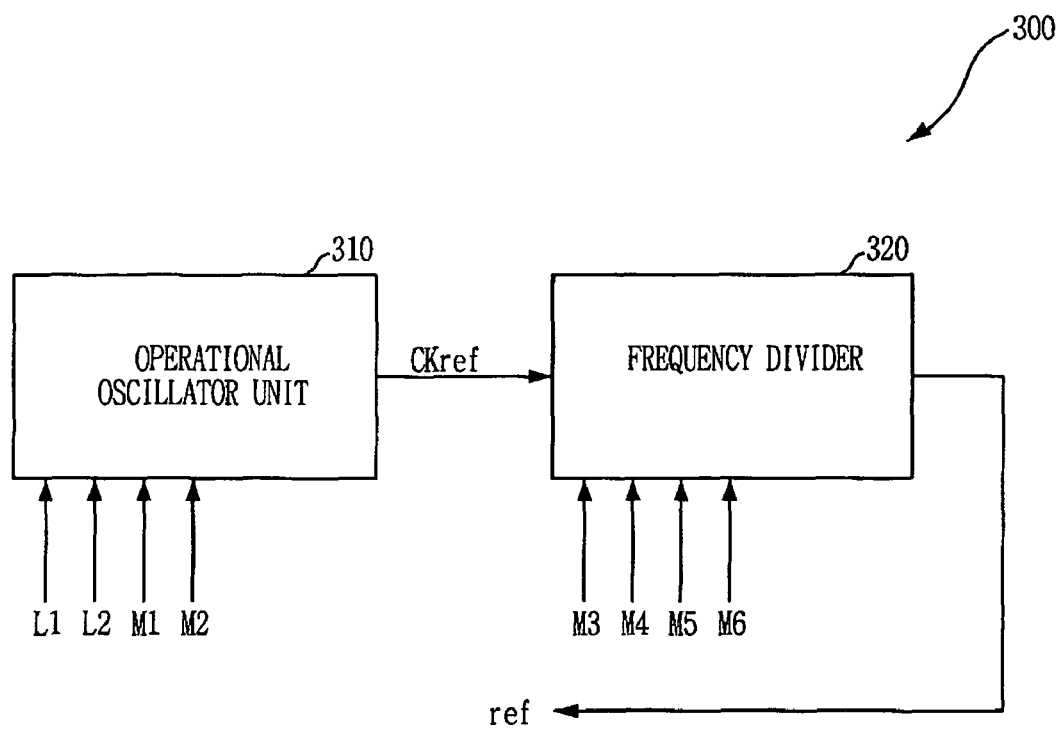
FIG. 9 is a block diagram showing a refresh controller shown in FIG. 5.

FIG. 9 is a block diagram showing the refresh controller 300 shown in FIG. 5.

As shown, the refresh controller 300 includes a refresh operational oscillator unit 310 and a frequency divider 320.

The refresh operational oscillator unit 310 generates a frequency controlled clock signal CKref in response to the first and the second upper bit signals M1 and M2 and the first and the second lower bit signals L1 and L2.

The frequency divider 320 divides the frequency controlled clock signal CKref based on the third to the sixth upper bit signals M3 to M6 in order to generate the refresh signal ref.

Figure 10:
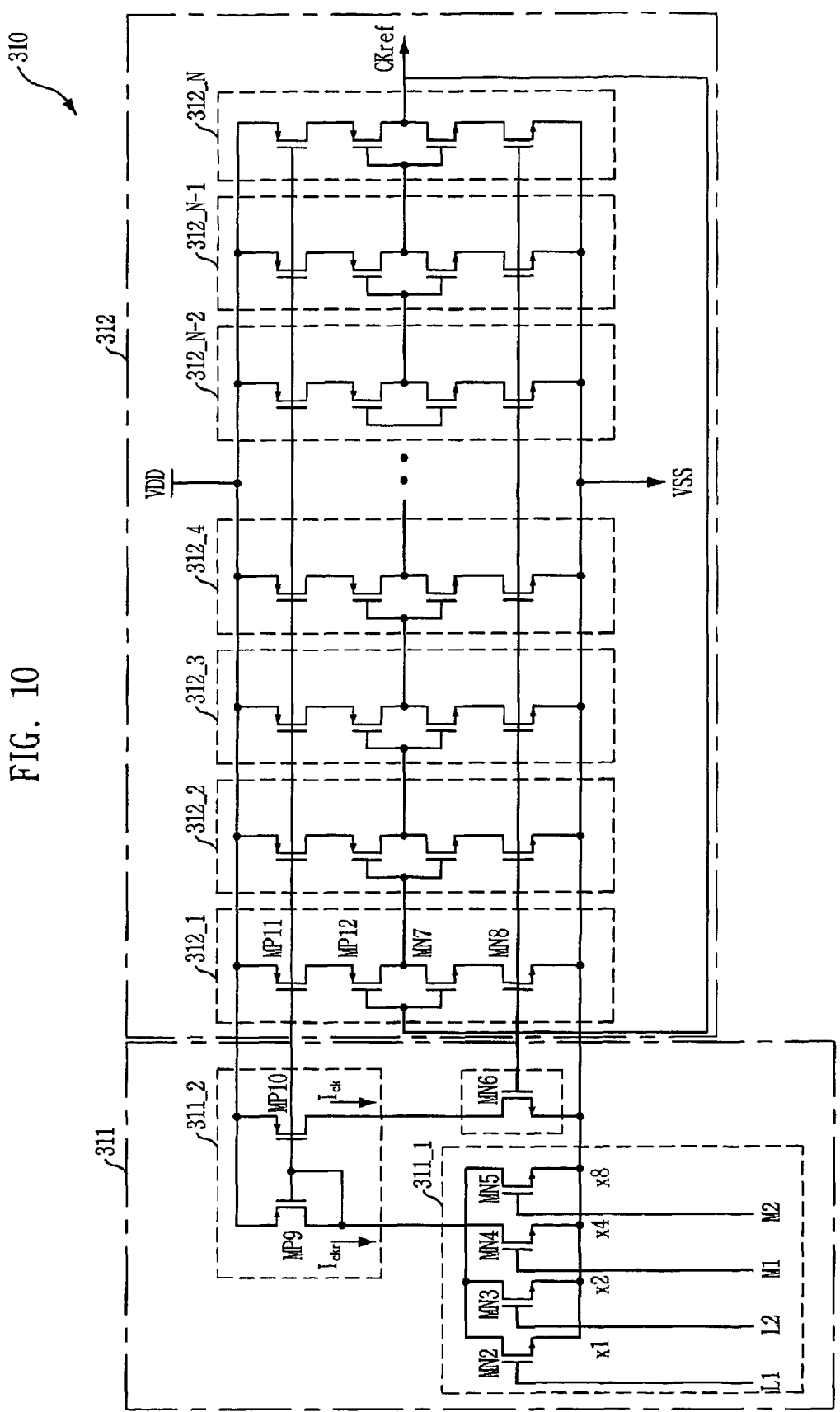
FIG. 10 is a schematic circuit diagram showing a refresh operational oscillator unit shown in FIG. 9.

FIG. 10 is a schematic circuit diagram showing the refresh operational oscillator unit 310 shown in FIG. 9.

As shown, the refresh operational oscillator unit 310 includes a clock oscillating reference current generation unit 311 and a ring oscillator 312. The clock oscillating reference current generation unit 311 generates a clock oscillating reference current Ickr in response to the first and the second upper bit signals M1 and M2 and the first and the second lower bit signals L1 and L2. The ring oscillator 312 generates the frequency controlled clock signal CKref by oscillating the clock oscillating reference current Ickr.

In detail, the clock oscillation reference current generation unit 311 includes a clock oscillating reference current control unit 311_1 and a current mirroring unit 311_2.

The current mirroring unit 311_2 includes a ninth PMOS transistor MP9 and a tenth PMOS transistor MP10 for respectively outputting the clock oscillating reference current Ickr and an operational current Ick. The clock oscillating reference current Ickr is flown from the power supply voltage VDD to a ground voltage VSS, and the operational current Ick is a mirrored current of the clock oscillating reference current Ickr.

The clock oscillating reference current control unit 311_1 includes a second to a fifth NMOS transistors MN2 to MN5 which are turned on/off by the first and the second lower bit signals L1 and L2 and the first and the second upper bit signals M1 and M2 respectively in order to control a current intensity of the clock oscillating reference current Ickr.

The clock oscillating reference current generation unit 311 further includes a sixth NMOS transistor MN6 in order to pass the operational current Ick to the ground voltage VSS.

Herein, channel widths of the second to the fifth NMOS transistors are respectively ×1, ×2, ×4 and ×8.

The ring oscillator 312 includes a first to an $n_{th}$ inverters 312_1 to 312_n connected in series. Herein, the n is an odd number.

The first inverter 312_1 includes an eleventh and a twelfth PMOS transistors MP11 and MP12 and a seventh and an eighth NMOS transistors MN7 and MN8 connected in series. The first to the $n_{th}$ inverters 312_1 to 312_n have the same structure.

An operation of the semiconductor memory device in accordance with the first embodiment of the present invention is described below referring to FIGS. 4 to 9.

The temperature sensor 100 detects the temperature of the semiconductor memory device and generates the temperature controlled voltage signal Vt based on the detected temperature.

Thereafter, the analog-digital converter 200 generates the N-bit digital signal based on the temperature controlled voltage signal Vt. Then, the refresh controller 300 generates the refresh signal ref according to the N-bit digital, and the memory core block 400 performs the refresh operation in response to the refresh signal ref.

Therefore, since a period of the refresh signal ref is controlled according to the temperature of the semiconductor memory device, the semiconductor can perform the refresh operation having an optimum refresh period.

In detail, an operation of the temperature sensor 100 is described below.

The first temperature sensing unit 110 generates the first current Ic which is decreased as the temperature increased, and the second temperature sensing unit 130 generates the second current Ip which is increased as the temperature increases.

A voltage between a base and an emitter of the third bipolar transistor Q3, i.e., a third base-emitter voltage Vbe3, is decreased about 2.1 mV if the temperature increases by one degree. However, a voltage between two sides of a resistor is hardly varied when the temperature is changed.

Therefore, since a main input terminal and a sub input terminal of the first comparator 111 are respectively connected to the first resistor R1 and the third bipolar transistor Q3, a voltage on the sub input terminal of the first comparator 111 is decreased as the temperature increased. As a result, a voltage on the output terminal of the first comparator 111 is increased.

Therefore, since the output terminal of the first comparator 111 is connected to gates of the fifth to the seventh PMOS transistors MP5 to MP7, the first current Ic is decreased. That is, the first current Ic is decreased as the temperature increased. Herein, the first current Ic follows a first equation shown below.

$$Ic = N \times (Vbe3)/R1 \qquad [\text{Eq. 1}]$$

Herein, the N is a proportional factor.

Thereafter, since a main input terminal of the first operational amplifier 121 receives a voltage loaded on the second resistor R2, a voltage loaded on an output terminal of the first operational amplifier 121 is decreased as the temperature increases. As a result, the temperature controlled voltage signal Vt is increased. Herein, the temperature controlled voltage signal Vt follows a second equation shown below.

$$Vt = R3 \times (R2 \times N \times Vbe3/R1)/R4 \qquad [\text{Eq. 2}]$$

Meanwhile, a main input terminal of the second operational amplifier 133 receives a voltage loaded on the fifth resistor R5 and the first bipolar transistor Q1 and a sub input terminal of the second operational amplifier 133 receives a voltage loaded on the second bipolar transistor Q2.

Since a voltage difference between the main input terminal and the sub input terminal is decreased as the temperature increased, a voltage loaded on an output terminal of the second operational amplifier 133 is decreased. As a result, since gates of the first to the third PMOS transistors are connected to the output terminal of the second operational amplifier 133, the second current Ip is increased as the temperature increases. Herein, the second current Ip follows a third equation shown below.

$$Ip = K \times (Vbe2 - Vbe1)/R5 \qquad [\text{Eq. 3}]$$

Herein, the K is a proportional factor. The Vbe2 is a second base-emitter voltage which is loaded between a base and an emitter of the second bipolar transistor Q2, and the Vbe1 is a first base-emitter voltage which is loaded between a base and an emitter of the first bipolar transistor Q1.

Thereafter, the reference current generator 140 outputs the reference current Iref which is a total current of the first and the second current Ic and Ip. Herein, the reference current Iref is flown to the analog-digital converter 200.

As mentioned above, the temperature sensor 100 generates the temperature controlled voltage signal Vt based on the first current Ic because the first current Ic is more sensitively varied than the second current Ip according to the temperature.

However, the temperature sensor 100 can be modified so that the temperature controlled voltage signal Vt can be generated based on the second current Ip. In this case, the main terminal of the second operational amplifier 121 is connected to a node between the third resistor R3 and the fourth resistor R4, and the sub terminal of the second operational amplifier 121 receives a voltage generated by the second current Ip.

An operation of the analog-digital converter 200 is described below in detail.

The second comparator 210 compares the temperature controlled voltage signal Vt and the input voltage Vin and outputs the comparison result to the binary up/down counter 220. Then, the binary up/down counter 220 increases or decreases of a digital value of the 8-bit digital signal according to the comparison result outputted from the second comparator 210.

Thereafter, the code conversion unit 250 converts the first to the sixth upper bit signals M1 to M6 the thermometer code and outputs the thermometer code to the segment digital-analog converter 270. Meanwhile, the delay unit 250 receives the first and the second lower bit signals L1 and L2 in order to output the first and the second lower bit signals L1 and L2 to the binary digital-analog converter 280 after delaying the first and the second lower bit signals L1 and L2 for the delay time generated while the code conversion unit 250 converts the first to the sixth upper bit signals M1 to M6 into the thermometer code.

Herein, if the first to the sixth upper bit signals M1 to M6 are directly inputted to the segment digital-analog converter 270 without the code conversion unit 250, a glitch is generated when the first to the sixth upper bit signals M1 to M6 are directly inputted to the segment digital-analog converter 270. Therefore, the code conversion unit 250 is employed in order to eliminate the glitch.

However, if all of the first to the sixth upper bit signals M1 to m6 and the first and the second lower bit signals M1 and M2 are converted to the thermometer code, a circuit size of the semiconductor memory device is increased. Therefore, only the first to the sixth upper bit signals M1 to M6 are converted to the thermometer code.

Table. 1 shows an example of the thermometer code.

TABLE 1

| BINARY NUMBER | | | THERMOMETER CODE | | | | | | |
|---|---|---|---|---|---|---|---|---|---|
| D3 | D2 | D1 | T7 | T6 | T5 | T4 | T3 | T2 | T1 |
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 1 |
| 0 | 1 | 1 | 0 | 0 | 0 | 0 | 1 | 1 | 1 |
| 1 | 0 | 0 | 0 | 0 | 0 | 1 | 1 | 1 | 1 |
| 1 | 0 | 1 | 0 | 0 | 1 | 1 | 1 | 1 | 1 |
| 1 | 1 | 0 | 0 | 1 | 1 | 1 | 1 | 1 | 1 |
| 1 | 1 | 1 | 1 | 1 | 1 | 1 | 1 | 1 | 1 |

As shown in Table. 1, the number of logic high bits of the thermometer code corresponds to a decimal value of the binary number.

Thereafter, the segment digital-analog converter 270 generates the first analog voltage signal Va based on the thermometer code. Likewise, the binary digital-analog converter 280 generates the second analog voltage signal Vb based on the delayed first and second lower bit signals L1 and L2.

Meanwhile, the digital-analog converter load unit 290 mixes the first and the second analog voltage signals Va and Vb in order to output a single analog voltage signal to the third operational amplifier 240. Then, the third operational amplifier 240 buffers the single analog voltage signal in order to generate the input voltage Vt.

The conversion controller 230 generates the enable signal en for activating/inactivating the second comparator 210 and the binary up/down counter 220 in response to the external enable control signal t_en.

Since the analog-digital converter 200 is operated only for the refresh operation. Therefore, the conversion controller 230 disables the analog-digital converter 200 by using the enable signal en when the semiconductor memory device does not perform the refresh operation.

The conversion controller 230 employs a ring oscillator for generating the enable signal en. That is, if the external enable control signal t_en is in a logic low level, the ring oscillator is disabled, and, thus, the enable signal en is inactivated as a logic low level. Therefore, the second comparator 210 and the binary up/down counter 220 are disables, and, consequently, the code conversion unit 250, the delay unit 260, the segment digital-analog converter 270, the binary digital-analog converter 280, the digital-analog converter load unit 290 and the third operational amplifier 240 are also disabled because the binary up/down counter 220 does not output a signal. On the other hand, the oscillator is enabled if the external enable control signal t_en is in a logic high level. Then, the analog-digital converter 200 is enabled.

Herein, the binary up/down counter 220 generates the 8-bit digital signal according to the temperature. However, the binary up/down counter 220 can be modified so that the number of bits of a digital signal generated by the binary up/down counter 220 can be smaller or larger than 8. If the number of bits of the digital signal generated by the binary up/down counter 220 is larger than 8, the period of the refresh signal ref can be more precisely controlled.

An operation of the refresh controller 300 is described below in detail.

The refresh controller 300 includes the refresh operational oscillator unit 310 and the frequency divider 320.

The refresh operational oscillator unit 310 generates the frequency controlled clock signal CKref in response to the first and the second upper bit signals M1 and M2 and the first and the second lower bit signals L1 and L2. The frequency divider 320 divides the frequency controlled clock signal CKref based on the third to the sixth upper bit signals M3 to M6 in order to generate the refresh signal ref.

The second to the fifth NMOS transistors MN2 to MN5 included in the clock oscillating reference current generation unit 311 are respectively turned on/off by the first and the second lower bit signals L1 and L2 and the first and the second upper bit signals M1 and M2. A current intensity of the clock oscillating reference current Ickr is determined by on/off states of the first and the second lower bit signals L1 and L2 and the first and the second upper bit signals M1 and M2. Herein, the second to the fifth NMOS transistor MN2 to MN5 have different channel widths.

The current mirroring unit 311_2 outputs the operational current Ick by mirroring the clock oscillating reference current Ickr, and the operational current Ick is flown to the ground voltage VSS through the sixth PMOS transistor MP6.

The ring oscillator 312 includes the first to the $n_{th}$ inverters 312_1 to 312_n connected in series, and each of the first to the $n_{th}$ inverters 312_1 to 312_n includes two current source MOS transistors. The current source MOS transistors included in the first to the $n_{th}$ inverters 312_1 to 312_n are turned on/off by the clock oscillating reference current Ickr and the operational current Ick. A frequency of the frequency controlled clock signal CKref is determined by on/off states of the current source MOS transistors included in the first to the $n_{th}$ inverters 312_1 to 312_n.

Thereafter, the frequency divider 320 generates the refresh signal ref by dividing the frequency controlled clock signal CKref based on the third to the sixth upper bit signals M3 to M6.

Herein, as mentioned above, the refresh operational oscillator unit 310 generates the frequency controlled clock signal CKref based on the first and the second lower bit signals L1 and L2 and the first and the second upper bit signals M1 and M2, and the frequency divider 320 generates the refresh signal ref based on the third to the sixth upper bit signals M3 to M6. However, the first to the sixth upper bit signals M1 to M6 and the first and the second lower bit signals L1 and L2 can be differently inputted to the refresh operational oscillator unit 310 and the frequency divider 320.

As described above, the semiconductor memory device in accordance with a first preferred embodiment of the present invention generates a temperature controlled voltage signal according to the temperature of the semiconductor memory device, and the temperature controlled voltage signal is converted to an N-bit digital signal. Then, the semiconductor memory device controls a period of a refresh operation based on the N-bit digital signal. Therefore, the semiconductor memory device can precisely control the period of the refresh operation according to the temperature.

Therefore, compared to the conventional semiconductor memory device, the semiconductor memory device can reduce its power consumption because it can precisely control the period of the semiconductor memory device according to a temperature variation.

Figure 11:
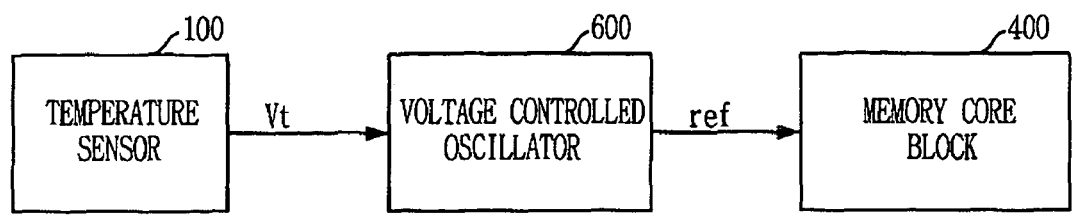
FIG. 11 is a schematic circuit diagram showing a semiconductor memory device in accordance with a second embodiment of the present invention.

FIG. 11 is a schematic circuit diagram showing a semiconductor memory device in accordance with a second embodiment of the present invention.

As shown, the semiconductor memory device includes a temperature sensor 100, a voltage controlled oscillator and a memory core block 400.

The temperature sensor 100 measures temperature of the semiconductor memory device in order to generate a temperature controlled voltage signal Vt according to the measured temperature.

The refresh controller 300 generates a refresh signal ref based on the temperature controlled voltage signal Vt.

The memory core block 400 performs a refresh operation in response to the refresh signal ref.

Structures and operations of the temperature sensor 100 and the memory core block 400 are the same as those of the temperature sensor 100 and the memory core block 400 shown in FIG. 5. Therefore, detailed descriptions of the temperature sensor 100 and the memory core block 400 are omitted.

The voltage controlled oscillator 600 internally oscillates an electrical signal and controls a frequency of the electrical signal based on the temperature controlled voltage signal Vt in order to output the frequency controlled electrical signal as the refresh signal ref. Therefore, the frequency of the refresh signal ref is controlled by the temperature of the semiconductor memory device. That is, if the temperature of the semiconductor memory device increases, a frequency of the refresh signal ref is increased. On the other hand, if the temperature of the semiconductor memory device decreases, the frequency of the refresh signal ref is decreased.

As a result, a period of the refresh operation is controlled according to the temperature of the semiconductor memory device.

Since the semiconductor memory device shown in FIG. 11 does not include the analog-digital converter 200 shown in FIG. 5, a size of the semiconductor memory device can be reduced.

As described above, the semiconductor memory device in accordance with the present invention can reduce power consumption by precisely controlling a period of a refresh operation. That is, since the refresh is performed not only at a data access mode but also at a standby mode of the semiconductor memory device, the power consumption of the semiconductor memory device can be dramatically reduced.

The present application contains subject matter related to Korean patent application No. 2003-98505, filed in the Korean Patent Office on Dec. 29, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device capable of performing a refresh operation according to a temperature variation, comprising:
    a temperature sensing means for measuring temperature and for generating a temperature controlled voltage and a reference current based on the measured temperature;
    an analog-digital conversion means for converting the temperature controlled voltage to an N-bit digital signal in response to the reference current;
    a refresh control means for generating a refresh signal in response to the N-bit digital signal,
    wherein, a period of the refresh signal is controlled based on the N-bit digital signal,
    wherein the temperature sensing means includes:
        a first temperature sensing unit for generating a first current which is increased when the measured temperature is decreased and is decreased when the measured temperature is increased; and
        a temperature controlled voltage generation unit for generating the temperature controlled voltage.

2. The semiconductor memory device as recited in claim 1, wherein the temperature sensing means further includes:
    a second temperature sensing unit for generating a second current which is increased when the measured temperature is increased and is decreased when the measure temperature decreases; and
    a reference current generation unit for generating the reference current which is a total current of the first current and the second current.

3. The semiconductor memory device as recited in claim 2, wherein the first temperature sensing unit includes:
    a first unit temperature sensor including a resistor for generating a first voltage which has a constant voltage level when the measured temperature is changed;
    a second unit temperature sensor including a bipolar transistor for generating a second voltage which is decreased when the measured temperature increases;
    a comparator for comparing voltage levels of the first voltage and the second voltage; and
    an output unit for generating the first current based on the comparison result of the comparator.

4. The semiconductor memory device as recited in claim 2, wherein the second temperature sensing unit includes:
    a first unit temperature sensor including a resistor and a first bipolar transistor connected in series;
    a second unit temperature sensor including a second bipolar transistor; and
    a comparator for comparing a voltage inputted to the first bipolar transistor and a voltage inputted to the second bipolar transistor.

5. The semiconductor memory device as recited in claim 2, wherein the first temperature sensing unit includes:
    a first MOS transistor whose one side is connected to a power supply voltage;
    a first resistor which is connected between the first MOS transistor and a ground voltage;
    a second MOS transistor whose gate is connected to a gate of the first MOS transistor;

a first bipolar transistor which is connected between the second MOS transistor and the ground voltage;

a first operational amplifier whose first input terminal, second input terminal and an output terminal are respectively connected to the first MOS transistor, the second MOS transistor and gates of the first and the second MOS transistors;

a third MOS transistor whose gate is connected to gates of the first and the second MOS transistors; and a second resistor which is connected between the third MOS transistor and the ground voltage, wherein the first current is outputted from the third MOS transistor and the second resistor.

6. The semiconductor memory device as recited in claim 5, wherein the temperature controlled voltage generation unit includes:

a fourth MOS transistor connected to the power supply voltage;

a third and a fourth resistors connected in series between the fourth MOS transistor and the ground voltage; and a second operational amplifier whose first input terminal, a second input terminal and an output terminal are respectively connected to the second resistor, a node between the third and the fourth resistors and a gate of the fourth MOS transistor, wherein the temperature controlled voltage is outputted from a node between the fourth MOS transistor and the third resistor.

7. The semiconductor memory device as recite in claim 6, wherein the second temperature sensing unit includes:

a fifth MOS transistor connected to the power supply voltage;

a fifth resistor connected to the fifth MOS transistor;

a second bipolar transistor which is connected between the fifth resistor and the ground voltage;

a sixth MOS transistor whose gate is connected to a gate of the fifth MOS transistor;

a third bipolar transistor which is connected between the sixth MOS transistor and the ground voltage; and a third operation amplifier whose first input terminal, a second input terminal and an output terminal are respectively connected to the fifth resistor, one terminal of the sixth MOS transistor and a gate of the sixth MOS transistor.

8. The semiconductor memory device as recited in claim 7, wherein the reference current generation unit includes:

a seventh MOS transistor whose gate is connected to gates of the fifth and the sixth MOS transistors an eighth MOS transistor whose gate is connected to gates of the first to the third MOS transistors; and a ninth MOS transistor which is connected between drains of the seventh and the eighth MOS transistors and the ground voltage.

9. The semiconductor memory device as recited in claim 1, wherein the temperature sensing means includes:

a temperature sensing unit for generating a temperature controlled current which is increased when the measured temperature increases and is decreased when the measured temperature decreases; and a temperature controlled voltage generation unit for generating the temperature controlled voltage in response to the temperature controlled current.

10. The semiconductor memory device as recited in claim 9, wherein the temperature sensing unit includes:

a first unit temperature sensor including a first bipolar transistor connected to the resistor;

a second unit temperature sensor including a second bipolar transistor; and a comparator for comparing voltage levels of a voltage inputted to the first bipolar transistor and the second bipolar transistor.

11. The semiconductor memory device as recited in claim 1, wherein the refresh control means includes:

a refresh operational oscillator unit for generating a frequency controlled clock signal based on first predetermined bits of the N-bit digital signal; and a frequency divider for generating the refresh signal by dividing the frequency controlled clock signal based on second predetermined bits of the N-bit digital signal.

12. The semiconductor memory device as recited in claim 11, wherein the refresh operational oscillator unit includes:

a clock oscillating reference current generation unit for generating a clock oscillating reference current; and a ring oscillator for generating the frequency controlled clock signal based on the clock oscillating reference current.

13. The semiconductor memory device as recited in claim 12, wherein the clock oscillating reference current generation unit includes:

a current mirroring unit for generating an operational current by mirroring the clock oscillating reference current;

a plurality of first MOS transistors which are turned on/off based on the first predetermine bits of the N-bit digital signal for controlling a current intensity of the clock oscillating reference current; and a second MOS transistor for transferring the operational current to a ground voltage.

14. The semiconductor memory device as recited in claim 13, wherein the ring oscillator includes a plurality of inverters connected in series, wherein an output signal of a last inverter of the plurality of inverters is inputted to an input terminal of a first inverter of the plurality of inverters.

15. The semiconductor memory device as recited in claim 14, wherein each of the plurality of inverters includes:

a third MOS transistor which is connected to a power supply voltage for mirroring the clock oscillating reference current;

a fourth MOS transistor whose gate is connected to the second MOS transistor for mirroring the clock oscillating reference current; and a fifth and a sixth MOS transistors connected in series between the third and the fourth MOS transistors.

16. The semiconductor memory device as recited in claim 15, wherein the analog-digital conversion means includes:

a voltage comparator for comparing the temperature controlled voltage and an internal voltage;

a binary up/down counter for increasing or decreasing a digital value of the N-bit digital signal;

a code conversion unit for converting first predetermined bits of the N-bit digital signal into a thermometer code;

a delay unit for delaying second predetermined bits of the N-bit digital signal for a time period while the code conversion unit converts the first predetermined bits of the N-bit digital signal;

a segment digital-analog converter for converting the thermometer code to a first analog signal;

a binary digital-analog converter for converting an output signal of the delay unit to a second analog signal; and a voltage conversion means for converting the first and the second analog signals into the internal voltage.

17. The semiconductor memory device as recited in claim 16, wherein the segment digital-analog converter and the binary digital-analog converter generates the first and the second analog signals based on the reference current.

18. The semiconductor memory device as recited in claim 16, wherein the analog-digital conversion means further includes a conversion controller for enabling/disabling the voltage comparator and the binary up/down counter in response to an external enable signal.

19. The semiconductor memory device as recited in claim 18, wherein the conversion controller includes:
   a NAND gate for receiving the external enable signal; and
   a plurality of inverters connected in series whose output signal is inputted to the NAND gate.

20. A semiconductor memory device capable of performing a refresh operation, comprising:
   a temperature sensing means for measuring temperature and for generating a temperature controlled voltage and a reference current based on the measured temperature; and
   a voltage controlled oscillator for generating a refresh signal based on the temperature controlled voltage,
   wherein a period of the refresh signal is controlled by the temperature controlled voltage,
   wherein the temperature sensing means includes:
   a temperature sensing unit for generating a temperature controlled current which is increased when the measured temperature increases and is decreased when the measured temperature decreases; and
   a temperature controlled voltage generation unit for generating the temperature controlled voltage in response to the temperature controlled current.

21. The semiconductor memory device as recited in claim 20, wherein the temperature sensing unit includes:
   a first MOS transistor whose one side is connected to a power supply voltage;
   a first resistor which is connected between the first MOS transistor and a ground voltage;
   a second MOS transistor whose gate is connected to a gate of the first MOS transistor;
   a first bipolar transistor which is connected between the second MOS transistor and the ground voltage;
   a first operational amplifier whose first input terminal, second input terminal and an output terminal are respectively connected to the first MOS transistor, the second MOS transistor and gates of the first and the second MOS transistors;
   a third MOS transistor whose gate is connected to gates of the first and the second MOS transistors; and
   a second resistor which is connected between the third MOS transistor and the ground voltage,
   wherein the first current is outputted from the third MOS transistor and the second resistor.

22. The semiconductor memory device as recited in claim 21, wherein the temperature controlled voltage generation unit includes:
   a fourth MOS transistor connected to the power supply voltage;
   a third and a fourth resistors connected in series between the fourth MOS transistor and the ground voltage; and
   a second operational amplifier whose first input terminal, a second input terminal and an output terminal are respectively connected to the second resistor, a node between the third and the fourth resistors and a gate of the fourth MOS transistor,
   wherein the temperature controlled voltage is outputted from a node between the fourth MOS transistor and the third resistor.

23. The semiconductor memory device as recited in claim 20, wherein the temperature sensing means includes:
   a temperature sensing unit for generating a temperature controlled current which is increased when the measured temperature increases and is decreased when the measured temperature decreases; and
   a temperature controlled voltage generation unit for generating the temperature controlled voltage in response to the temperature controlled current.

24. The semiconductor memory device as recited in claim 23, wherein the temperature sensing unit includes:
   a resistor;
   a first unit temperature sensor including a first bipolar transistor connected to the resistor;
   a second unit temperature sensor including a second bipolar transistor; and
   a comparator for comparing voltage levels of a voltage inputted to the first bipolar transistor and the second bipolar transistor.

* * * * *